(12) United States Patent
Levitt

(10) Patent No.: US 6,509,729 B2
(45) Date of Patent: Jan. 21, 2003

(54) MULTIPLE SIMULTANEOUS OPTICAL FREQUENCY MEASUREMENT

(75) Inventor: Hal L. Levitt, Baltimore, MD (US)

(73) Assignee: The United States of America as represented by the Secretary of the Navy, Washington, DC (US)

(*) Notice: Subject to any disclaimer, the term of this patent is extended or adjusted under 35 U.S.C. 154(b) by 24 days.

(21) Appl. No.: 09/756,239

(22) Filed: Jan. 9, 2001

(65) Prior Publication Data

US 2002/0121890 A1 Sep. 5, 2002

(51) Int. Cl.[7] ............................................... G01R 23/17
(52) U.S. Cl. ............................ 324/76.36; 324/76.35; 324/76.37
(58) Field of Search ........................ 324/76.35, 76.36, 324/76.37; 342/445; 356/388, 481; 702/77, 79, 75, 76, 29

(56) References Cited

U.S. PATENT DOCUMENTS

| | | | | |
|---|---|---|---|---|
| 3,727,062 A | * | 4/1973 | Foster | 359/130 |
| 5,058,190 A | | 10/1991 | Levitt et al. | 382/324 |
| 5,105,380 A | * | 4/1992 | Owechko | 364/825 |
| 5,109,188 A | | 4/1992 | Sanderson et al. | 324/76.35 |
| 5,267,188 A | | 11/1993 | Pape et al. | 708/821 |
| 5,281,907 A | * | 1/1994 | Hartup et al. | 324/76.37 |
| 5,327,142 A | * | 7/1994 | Tsui et al. | 342/192 |
| 5,641,954 A | * | 6/1997 | Keefer et al. | 250/227.12 |
| 5,682,238 A | | 10/1997 | Levitt et al. | 356/450 |
| 5,694,216 A | | 12/1997 | Riza | 356/485 |
| 5,734,578 A | * | 3/1998 | Oh | 702/77 |
| 5,805,317 A | * | 9/1998 | Snawerdt, III et al. | 359/109 |
| 6,061,135 A | | 5/2000 | Levitt et al. | 356/521 |
| 6,307,895 B1 | * | 10/2001 | Alexander et al. | 375/316 |
| 6,320,917 B1 | * | 11/2001 | Stott et al. | 375/344 |

OTHER PUBLICATIONS

F.A. Polkinghorn, Jr., et al., "Ambiguity Resolution in the SPASUR Radio Interferometer Direction Finding System," NRL Report 6603, Oct. 12, 1967.
Navy SBIR Award Web page, http://www.navysbir.brtrc.com/sbirsearch/sbirsearch/sbir/n98a00001270.htm Dec. 15, 1998.

(List continued on next page.)

Primary Examiner—Christine Oda
Assistant Examiner—Walter Benson
(74) Attorney, Agent, or Firm—John J. Karasek; Dorothy I. Becker

(57) ABSTRACT

A signal processing apparatus for providing concurrent electrical frequency measurements of multiple, time-coincident signal inputs. In one embodiment of the present invention, an input signal is received that contains a plurality of individual signals independent of each other in frequency, phase, and electrical amplitude. A power splitter splits the input signal into two separate input signals. A delay line introduces a time delay to one of the two separate input signals. Two Bragg cells within a channelized optical phase measurement (COPM) device modulates two optical carrier signals with the delayed and non-delayed input signals, respectively, separating the modulated delayed and non-delayed input signals into multiple time-concurrent frequency channel signals. Upon exiting the Bragg cells, the two optical beams interfere spatially to develop an interference pattern along the phase and frequency channel number axes of a photodetector array. The resulting spatial intensity pattern phase variation is decoded to provide coarse frequency, phase, and amplitude measurements. A frequency encoder receives the photodetector outputs, corrects phase and amplitude data offsets, and converts phase to fine frequency. Finally, the frequency formatter concatenates coarse to fine frequency for readout.

38 Claims, 6 Drawing Sheets

OTHER PUBLICATIONS

Phase I Summary Report Web Page, http://www.navysbir.brtrc.com/sbirsearch/sbirsearch/sbir/aurororap1.html Dec. 12, 2000.

Navy SBIR Award Web Page, http://www.navysbir.brtrc.com/sbirsearch/sbirsearch/sbir/n98a00000536.htm Jun. 15, 1998.

Phase I Summary Report Web Page, http://www.navysbir.brtrc.com/sbirsearch/sbirsearch/sbir/adventp1.html Dec. 5, 2000.

Navy SBIR Award Web Page, http://www.navysbir.brtrc.com/sbirsearch/sbirsearch/sbir/n98a00001400.htm Dec. 15, 1998.

Phase I Summary Report Web Page, http://www.navysbir.brtrc.com/sbirsearch/sbirsearch/sbir/orincon4p1.html Dec. 5, 2000.

Phase I Summary Report Web Page, http://www.navysbir.brtrc.com/sbirsearch/sbirsearch/sbir/interspacep1.html Dec. 2000.

* cited by examiner

MULTIPLE SIMULTANEOUS OPTICAL FREQUENCY MEASUREMENT

BACKGROUND OF THE INVENTION

1. Field of the Invention

The present invention is directed to electrical frequency measurement, and particularly to a signal processing apparatus for providing accurate temporal frequency measurement of multiple time-coincident radio frequency ("RF") signals over a wide instantaneous bandwidth and dynamic range.

2. Description of the Related Art

Electrical frequency measurement is a requirement for numerous signal processing, communication, and signal measurement systems in use today and in the foreseeable future. A wide instantaneous operating bandwidth is essential in many systems. Frequency is a key measurement parameter for the purpose of RF signal tracking, characterization, and identification. Commercial and military applications operating in congested RF environments must process multiple signals simultaneously and provide measurement of selected signals while rejecting other undesirable interfering signals within the operating bandwidth. Present day applications include satellite and terrestrial communications systems, radar receivers, air traffic control radar, and RF test equipment.

Existing equipment implement one or more frequency measurement devices including instantaneous frequency measurement ("IFM") receivers, frequency discriminators, and channelized receivers. Each alternative has drawbacks. For example, most frequency discriminators and IFMs operate within a limited internal input signal dynamic range, typically within the saturation region, and, hence, require additional circuits to constrain input signals to this region. Because these devices are not frequency channelized, they are unable to correctly resolve time-coincident pulse-on-pulse or pulse-on-continuous wave ("CW") signals. These devices are constrained to handle a single signal at a time. If a second signal occurs in the same time window, an IFM cannot measure the second signal. RF channelizer technology alone cannot provide sufficient frequency resolution without incurring a high cost for the required large number of equivalent RF filter bank elements and video circuitry, and suffer from false "rabbit ears" triggering with such narrow filter widths. In addition, RF channelizers provide only relatively coarse frequency measurements.

Furthermore, because the IFM can measure only one signal at a time, a CW wave (i.e., a signal that is very long in pulse width) can hinder the ability of an IFM to measure the remaining environment. Thus, by driving an IFM with a strong signal that is turned on continuously, the IFM becomes unable to operate and collect other threats in the environment.

A U.S. patent of interest includes U.S. Pat. No. 5,682,238 to Levitt et al. (the subject matter of which is incorporated herein by reference), which discloses a signal processing apparatus with an optical phase measurement processor that provides phase difference measurements of multiple signal inputs.

SUMMARY OF THE INVENTION

The present invention measures frequency of multiple, time-coincident (i.e., two or more signals in which a portion of one signal duration coincides in time with a portion of one or more other signal durations) RF signals within a wide instantaneous input bandwidth and dynamic range. In one embodiment of the present invention, RF delay line 104 circuits are combined with a single optical processor 200, a spatial-domain phase measurement technique, and associated algorithms to provide simultaneous fine frequency measurement resolution that is maintained over the entire dynamic range. RF delay line 104 and power splitter 102 components provide two wideband RF inputs for the optical processor 200, one time-delayed relative to the other. Channelizer processing circuitry utilizes optical processor photodetector outputs to perform signal detection, coarse frequency estimation, fine frequency estimation, frequency and phase calibration, and combination of coarse and fine frequency for final output.

Multiple signal inputs of interest are simultaneously detected and measured in frequency, and optionally, other time-domain parameters. Basic frequency measurement occurs through two concurrent processes—detection of signal presence with (1) coarse frequency measurement, and (2) fine frequency measurement. Both functions are performed in a single measurement cycle.

Detection and coarse frequency measurement are achieved through modulator induced optical beam deflection onto a photodetector array 212, wherein active detector positions directly correspond to incident RF signal spectral components. Within a corresponding photodetector element bandwidth, fine frequency is obtained by measurement of relative phase difference between the original RF0 and a delayed version RF1 of the incident RF signal, effectively through frequency to phase translation. This is accomplished by RF modulation of two optical input beams 205 followed by projection of the modulated beams to produce an optical interference pattern upon the photodetector elements. The resulting spatial intensity pattern phase variation is decoded by an efficient spatial sampling technique and associated algorithms, such as those employed in the '238 patent.

The delay time is selected to achieve a specified fine frequency resolution and provide unambiguous phase measurement within one coarse frequency resolution width. The number of photodetector elements along the frequency deflection axis of the photodetector array 212, instantaneous operating bandwidth, in conjunction with other opto-electronic design parameters determine the effective coarse frequency resolution.

The photodetector outputs are applied to a frequency encoder 400 circuit to correct the raw phase and amplitude (or magnitude) data offsets, detect and locate active signals within the array 212, convert phase to fine frequency, and finally, concatenate coarse to fine frequency for readout. The encoded combination of coarse frequency with fine frequency discriminator output permits precision frequency measurement over the entire system bandwidth. Additionally, multiple time-coincident RF input sources, which are resolvable in frequency, can be processed in parallel using the present invention.

Unlike commercial electronic frequency discriminator and IFM devices, the present invention permits frequency measurement of multiple, time-coincident, and continuous wave signals, which is a shortfall of these single channel devices. The present invention has a separation at the frequency subchannels, and each subchannel performs the frequency discriminator type operation simultaneously. Most frequency discriminators and IFMs function similar to only one subchannel of the present invention, thereby processing the composite input bandwidth without first separating individual RF signals. This often leads to gross frequency measurement errors under time-coincident signal conditions.

Compared to other multi-channel techniques, such as RF filter banks and channelized receivers, the present invention provides increased frequency measurement resolution using intrachannel phase-based techniques, with sustainable accuracy across the entire operating bandwidth and temperature range through continuous phase offset correction. Current frequency discriminator and IFM devices must operate with a saturated input and therefore function (internally) over a limited amplitude dynamic range to attain accurate measurements. In contrast, the present invention functions correctly over a much wider dynamic range, limited principally by noise and photodetector saturation. This extends the achievable system dynamic range and eliminates RF limiting circuitry, resulting in reduced system cost and improved performance.

Additionally, coherent (IF output) or incoherent (video output) signal detection can be utilized in the present invention. Incoherent or power detection simplifies subsequent signal processing hardware requirements, operating at relatively narrow video bandwidth. In contrast, coherent or heterodyne detection requires more complex processing hardware operating at intermediate frequencies ("IF"), but, in principle, can achieve a larger dynamic range. A typical coherent approach requires optical carrier mixing and filtering operations to convert the RF modulated optical photodetector output to a corresponding electrical IF signal, which must then be time-domain processed to measure frequency. The preferred embodiment discussed herein utilizes incoherent signal detection methods to illustrate a relatively simple and low cost approach to frequency measurement.

These, together with other advantages that will be subsequently apparent, reside in the details of construction and operation as more fully hereinafter described and claimed, reference being had to the accompanying drawings forming a part hereof, wherein like numerals refer to like parts throughout.

DESCRIPTION OF THE PREFERRED EMBODIMENTS

Figure 1:
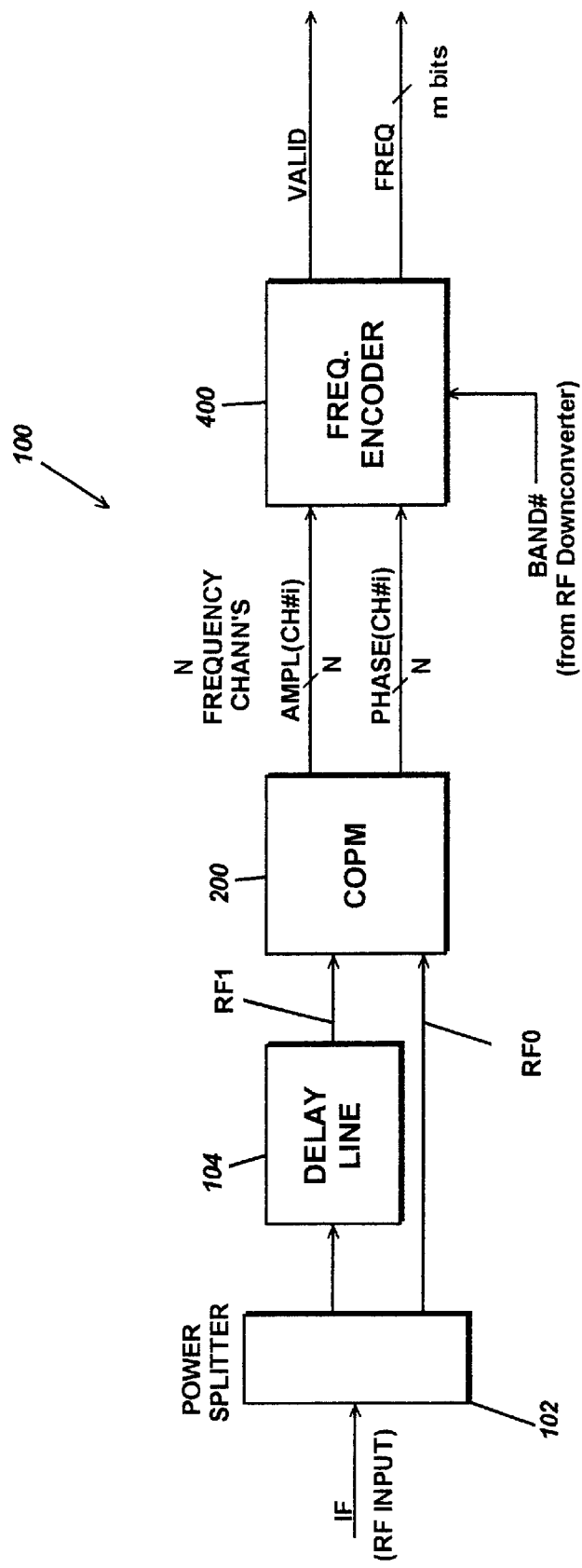
FIG. 1 is a schematic block diagram of a preferred embodiment of the multiple simultaneous optical frequency measurement apparatus of the present invention.

FIG. 1 illustrates a schematic block diagram of a preferred embodiment of the present invention, which is a multiple simultaneous optical frequency measurement ("MSOFM") apparatus 100. In FIG. 1, an RF input signal is split into two separate paths by an RF power splitter 102. One path incurs an additional fixed time delay relative to the other as a consequence of a delay line 104. The delayed RF1 and direct RF0 (non-delayed) signals then serve as inputs to a module providing multiple concurrent measurement and readout of coarse frequency, phase, and optionally magnitude, on a (coarse) frequency channelized basis. Preferably, the channelized optical phase measurement ("COPM") module 200 of the '238 patent is used, which extracts phase and amplitude of N parallel frequency channels simultaneously.

A frequency encoder 400 corrects phase and amplitude (or magnitude) data offsets, detects and locates active signals within a photodetector array 212 of the COPM 200 (described below), converts phase to fine frequency, and, finally, concatenates or otherwise combines coarse to fine frequency for readout, along with a signal indicating the data is valid and ready to be output. Periodic calibration interlaced or overlaid with normal operation (by employing an internal signal source) sustains system accuracy over time and temperature, and significantly reduces RF and optical component phase match requirements.

Other types of input signals may alternatively be used, such as sound, heat, light, electrical voltage, or any other measurable quantity capable of modulating or otherwise altering a carrier signal to impose frequency, phase, and optionally amplitude information.

Also, the delay line 104 lengths may vary, such that for the single MSOFM 100 system implementation, phase ambiguities can be avoided within a single coarse channel bandwidth. In addition, other technologies for the delay line 104 (e.g., a bulk acoustic wave delay line) and the power splitter 102 may be used. Although these components are depicted within the RF signal input path of the preferred embodiment, they may alternatively be implemented in the optical path.

Figure 2:
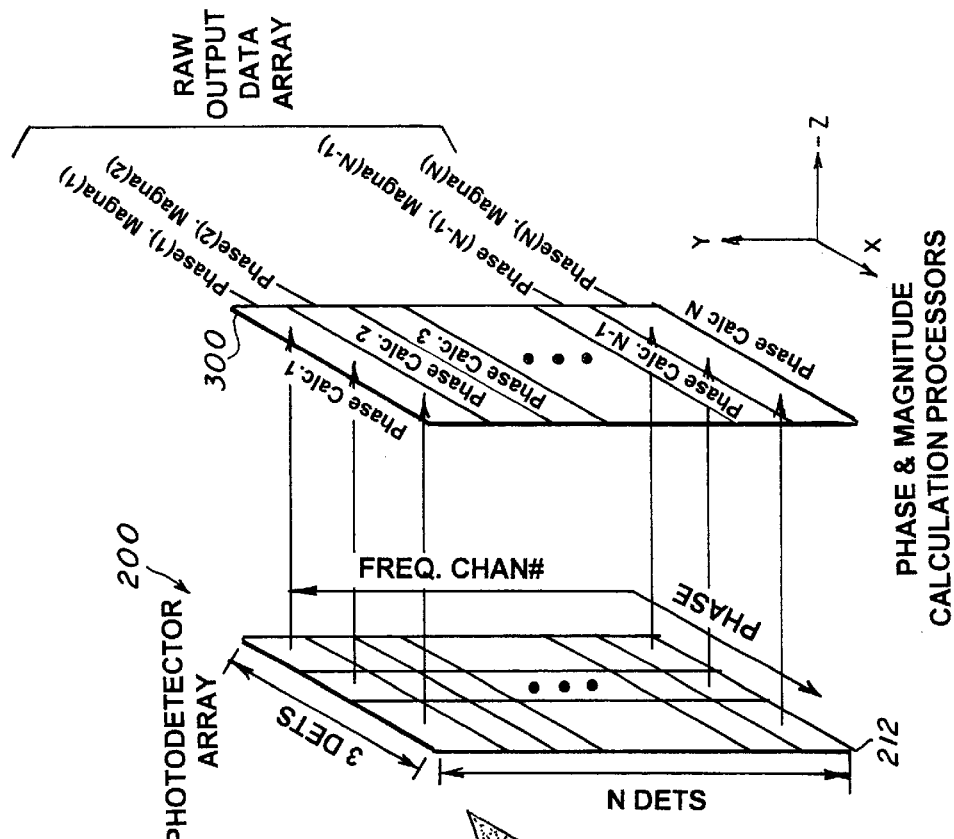
FIG. 2 is a schematic block diagram of the channelized optical phase measurement (COPM) module of FIG. 1 of the present invention.

FIG. 2 illustrates a schematic block diagram of the COPM module 200 of the present invention. The COPM module 200 provides phase and frequency measurements for each frequency bin or channel, corresponding to a sub-band of the composite RF operating bandwidth. A beam splitter 204 divides an optical beam from a laser 202 into two mutually coherent optical beams 205. The two optical beams 205 propagate through two separate channelizer circuits, preferably two acousto-optic Bragg cell modulators 206, that separate the input RF bandwidth into separate coarse frequency channels. Alternatively, a single Bragg cell 206 fabricated with dual RF transducers may be used. The Bragg cell 206 optical aperture spacing is independent of RF frequency or delay line 104 time.

Input signals RF0 and RF1, corresponding to direct and delayed RF environment, respectively, are injected into the Bragg cells 206. Within the Bragg cells 206, each light beam 205 is modulated by the frequency and phase of its associated RF input, imposing incident RF signal amplitude and frequency (and inherently phase) onto each optical carrier. Thus, a relative phase difference at the IF input is replicated in the Bragg cell 206 optical outputs 207.

In addition to optical carriers, the carrier may also be represented in other forms (e.g., radio waves) or other frequency spectral ranges as well. Thus, for example, RF applications may use microwave, millimeter-wave bands, or optical carriers at infrared or ultraviolet wavelengths.

Upon exiting the Bragg cells 206, the two optical beams 207 interfere spatially to develop an interference pattern. This optical interference pattern is Fourier-transformed by a Fourier Transform lens 210 and imaged onto an area detector or photodetector array 212, providing a spectral decomposition of the incident RF spectrum.

One axis (Y-axis) of the photodetector array 212 corresponds to frequency channel number ("Frequency Chan#"), while the orthogonal axis (X-axis) corresponds to relative signal phase (and amplitude) information in spatial form as a sinusoidal intensity pattern. The two optical beams are deflected along the Frequency Chan# axis at an angle approximately proportional to the incident RF signal frequency. Because both RF inputs, RF0 and RF1, are identical with the exception of a time delay, their spectral intensity decomposition patterns are also identical along the Frequency Chan# axis. Thus, the resulting photodetector image intensity modulation pattern is two-dimensional, with phase interference occurring along the phase or X-axis and the RF signal Fourier transform occurring along the Frequency Chan# axis.

At a Frequency Chan# axis position associated with the RF frequency of the signal to be measured, a differential phase corresponding to the time delay between RF inputs, and thereby proportional to frequency, is imposed onto the optical beams 205. This results in an interference pattern spatial phase proportional to input RF frequency, which is subsequently converted to a fine frequency estimate by algorithms implemented within the frequency encoder 400.

Each coarse channel bin unambiguously resolves frequency to within one phase rotation. This is accomplished by using either or both of the following exemplary techniques: (1) reducing coarse channel width to less than one equivalent fine frequency phase rotation, and (2) utilizing adjacent coarse channel response magnitudes to interpolate within one channel. Other alternative methods may be employed to satisfy this objective.

Figure 3:
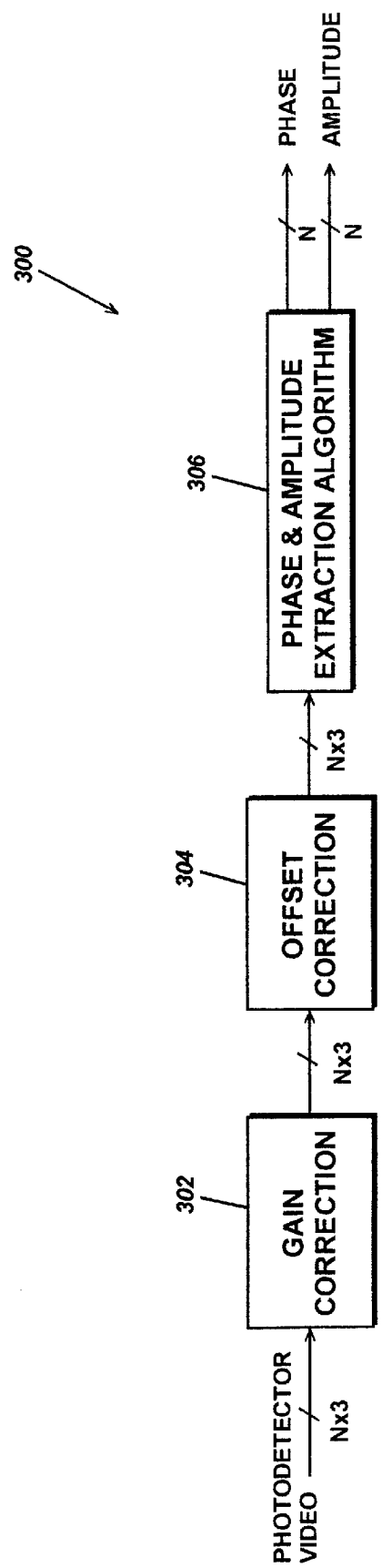
FIG. 3 is a flow diagram of photodetector video processing within the COPM of FIG. 2.

In a preferred implementation, the COPM 200 uses an efficient three-point spatial sampling scheme. The photodetector array 212 phase axis contains three detector elements that sample the interference pattern at fixed spatial locations chosen to most efficiently transform the three photodetector voltage outputs representing optical intensities to RF phase difference using a simple phase extraction algorithm 306 (FIG. 3).

The embodiment shown in FIG. 2 depicts three outputs from each photodetector array 212 row (corresponding to Frequency Chan#i, for i from 1 to N) being applied to one of a multitude of phase extraction processors 300, each applying the aforementioned algorithm 306 to calculate a phase difference between the two RF inputs. An advantage of using three (or more) detector outputs for phase measurement is the added capability of measuring RF signal magnitude (or absolute amplitude), which is necessary for subsequent threshold detection and centroid operations performed within the frequency encoder 400 (described below).

Use of the three-detection element spatial sampling format and algorithm provides high measurement accuracy and built-in correction for detector amplitude offsets, which vary as a function of input and reference carrier signal strength. User of fewer (e.g., three) spatial sampling-detection elements also results in higher speed and less complex implementation of the apparatus.

The detectors of the photodetector array 212 may be a single integrated device, or the detectors may be multiple separate detectors adjacently positioned at the Fourier transform plane or remotely located, such that Fourier transform plane information is transferred to appropriate detector elements. One example is to position an array of optical fibers at the Fourier plane, the fibers effectively transporting the light intensity pattern to a remotely located array of individual photodetectors.

The spatial intensity pattern phase variation is preferably decoded by the COPM 200 optical processor of the '238 patent to provide coarse frequency, phase, and amplitude measurement functionality. The COPM 200 performs coarse RF channelization by, for example, a dual transducer acousto-optic Bragg cell modulator within the optical processor, which is an operation analogous to an RF filter bank, with filter output detection accomplished by the array 212 of photodetector elements.

Video and A/D conversion circuits (not shown) then encode individual photodetector element outputs into a binary-encoded digital format for subsequent digital processing. After digitization of photodetector video output, detection circuitry recognizes signal presence based on photodetector output level, or signal magnitude computation, and provides a coarse frequency estimate. Electrical phase measurements are then performed on the photodetected two-beam optical interference pattern using an optical spatial sampling technique.

FIG. 3 is a flow diagram of photodetector video processing within the phase extraction processors 300 of the COPM 200. In FIG. 3, "N"denotes the number of photodector elements along the Frequency Chan# axis. In this embodiment, three photodetector elements are used for phase measurement along the phase axis. A gain correction module 302 and an offset correction module 304 perform gain correction and offset correction, respectively, on the photodetector outputs (video) before processing by the extraction algorithm 306 for phase and amplitude. Not shown, but implicit, is A/D conversion of the video prior to processing for phase and amplitude. The operations of the phase extraction processors 300 may be implemented in either software, hardware, or a hybrid of both.

The configuration of RF delay line 104 and power splitter 102 circuits driving COPM 200 inputs corresponds to a classical delay-line frequency discriminator at each photodetector (coarse) frequency channel output. Discriminator operation is characterized by production of a variable relative phase difference between delayed and non-delayed signal paths linearly proportional to input frequency. COPM 200 optical processing translates incident electrical (time-domain) phase difference to a spatial image pattern retaining phase information sampling by three or more photodetectors at each frequency channel position.

Figure 4:
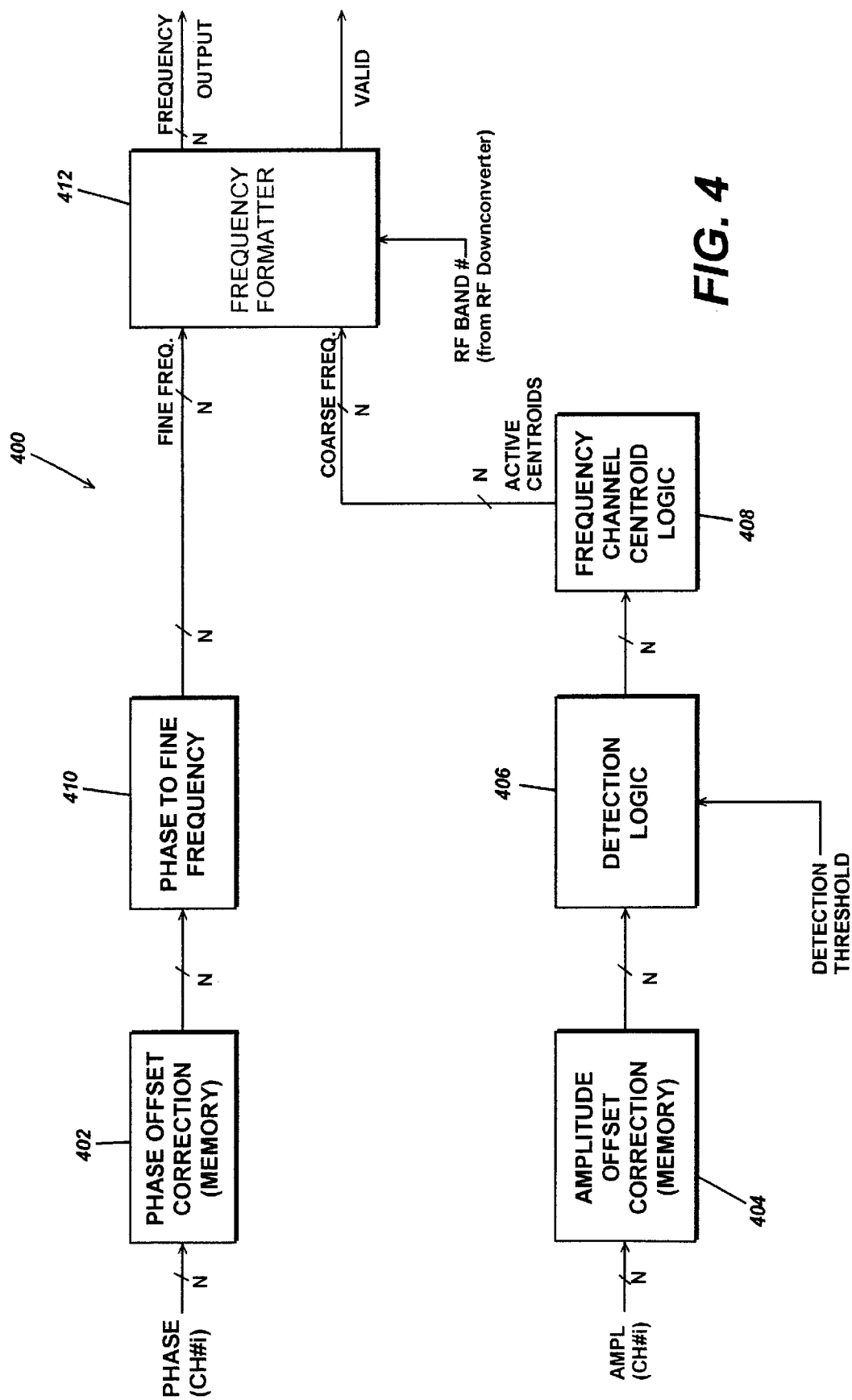
FIG. 4 is a flow diagram of processing within the frequency encoder module of FIG. 1 of the present invention.

FIG. 4 is a flow diagram of processing within the frequency encoder 400 of FIG. 1. A phase offset correction module 402 receives phase outputs from the COPM 200 and performs phase offset correction and coarse frequency offset corrections on a bin-to-bin basis. The corrected phase values are converted to fine frequency by a phase to fine frequency module 410.

The phase to fine frequency module 410 provides high resolution interpolation within a coarse channel bandwidth, representing the primary contributor to overall system frequency measurement performance. Within the phase to fine frequency module 410, measured phase difference is transformed to fine frequency shift (in Hertz) from an arbitrary reference, as given by the following equation:

$$\Delta F \cong \frac{\Delta \theta}{T \cdot 360} \tag{1}$$

where, $\Delta\theta$=measured phase difference (degrees),

T=time delay (secs),

360=conversion constant (degrees/Hertz).

To avoid fine frequency measurement ambiguity, the delay line 104 (FIG. 1) time is chosen to constrain phase shift to within +/−180 degrees corresponding to +/−0.5 coarse bin frequency width about the bin center frequency.

An amplitude offset correction module 404 receives amplitude outputs from the COPM 200 and performs amplitude offset correction. Phase offset correction and amplitude offset correction are achieved as necessary by subtraction of calibration offsets stored in memory associated with a particular coarse frequency channel.

A detection logic module 406 receives the corrected amplitude values and compares coarse channel amplitude to a predetermined threshold for detection of signal presence. After detection of signal presence, centroid logic operations within a frequency channel centroid logic module 408 determine the coarse frequency as the primary active channel within consecutive active channels.

A frequency formatter module 412 receives the fine frequency measurement from the phase to fine frequency module 410 and the coarse frequency measurement channel number (or index) from the frequency channel centroid logic module 408. The coarse frequency channel index is converted to a coarse frequency value (e.g., in MHz) within the frequency formatter 412. Alternatively, the coarse frequency channel index may be converted within the frequency channel centroid logic module 408. The calculated fine frequency is summed within the frequency formatter 412 to the coarse initial frequency associated with the active centroided coarse frequency channel number. The delay line 104 time is chosen to limit phase excursions to less than 360 degrees within a coarse channel bandwidth, removing the requirement for phase ambiguity resolution circuitry.

Finally, the frequency formatter 412 optionally uses the RF band number obtained from an RF downconverter 504 (FIG. 5) to correct coarse frequency offset, thereby selecting a starting frequency offset from, for example, circuits (such as calibration tables) embedded within the frequency formatter 412. The RF band number is used to sum a fixed global RF frequency offset to the current IF frequency estimate, thereby extending operational receiver measurement range to the entire input RF bandwidth. The frequency formatter module 412 outputs a "valid" signal indicating the data is valid and ready to be output, along with the summed frequency.

The frequency encoder 400 may be implemented in either software, hardware, or a hybrid of both. For example, look-up tables and sums may be used, such as a look-up table for phase to fine frequency determination. Also, phase offset correction and amplitude offset correction (i.e., calibration values) may be implemented as tables in memory to convert from relative numbers to actual values. For example, for amplitude, the correction is for flatness. The amplitude measured is a relative number, and the actual amplitude is the measured amplitude plus an offset.

The frequency formatter module 412 generates the final frequency for readout by, for example, concatenation of coarse and fine frequency, or summation of absolute starting frequency band number, coarse frequency offset to the band starting frequency, and fine frequency offset relative to coarse frequency. The band number may be determined from a look-up table (e.g., band #1 may correspond to 2,000 MHz). For speed, the frequency formatter module 412 is preferably implemented in hardware using, for example, a digital adder or digital tables.

Figure 5:
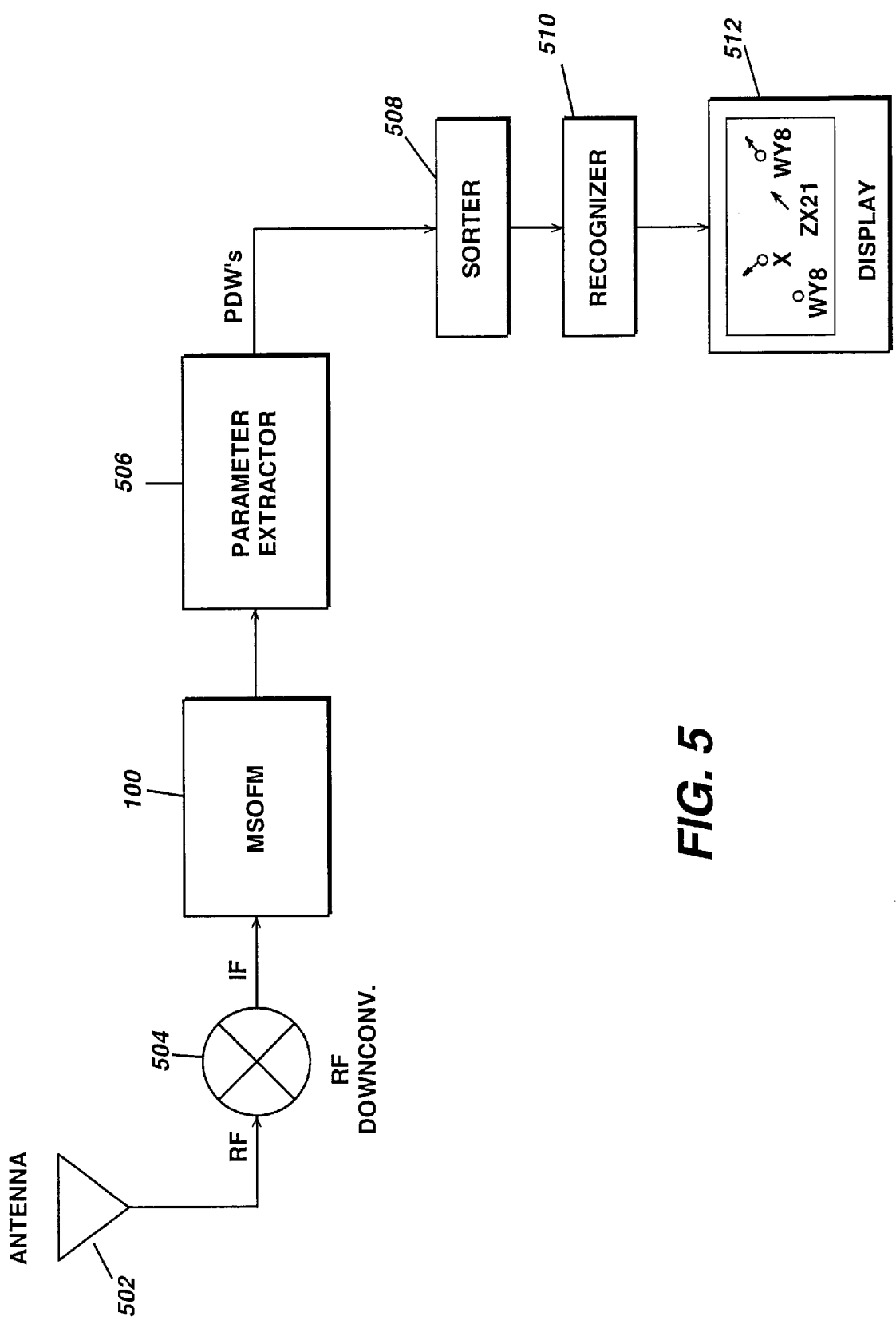
FIG. 5 is a schematic block diagram of the multiple simultaneous optical frequency measurement apparatus of the present invention in an exemplary radio frequency measurement application.

FIG. 5 is a schematic block diagram of the multiple simultaneous optical frequency measurement apparatus 100 of the present invention in an exemplary RF receiver application. An RF bandwidth containing multiple input signals of interest propagating in free-space is acquired by a reception antenna 502. An RF downconverter 504 then frequency translates the RF bandwidth to an appropriate IF band for injection into the present invention (i.e., the MSOFM) 100. The MSOFM 100 detects signal presence and measures signal parameters, primarily that of electrical frequency, for each signal in the active instantaneous IF bandwidth.

The MSOFM 100 outputs the measured signal parameters to a conventional parameter extractor 506. The parameter extractor 506 formats these (conceptually) parallel data patterns of signal parameters into pulse descriptor words (PDWs). Each PDW corresponds to a single measurement event. For each detected incident signal (e.g., radar) pulse, parameters for passive radar signal detection (e.g., coarse frequency, fine frequency, time of arrival (TOA), amplitude, and pulse repetition interval (PRI)) are measured, then formatted into a digital description of the single RF pulse event as a PDW, emphasizing composite fine frequency. The PDWs are processed by algorithms within a conventional signal sorter 508 to coalesce multiple isolated PDWs into a consolidated parametric description of the signal system type. A conventional recognizer 510 then database-associates the consolidated parametric description to a specific signal identification (ID) code for readout on a display 512. Parameter extractors, sorters, and recognizers are typical subsystem components of electronic support systems receivers and radar warning receivers (RWR), such as the AN/ALR-67 RWR.

Figure 6:
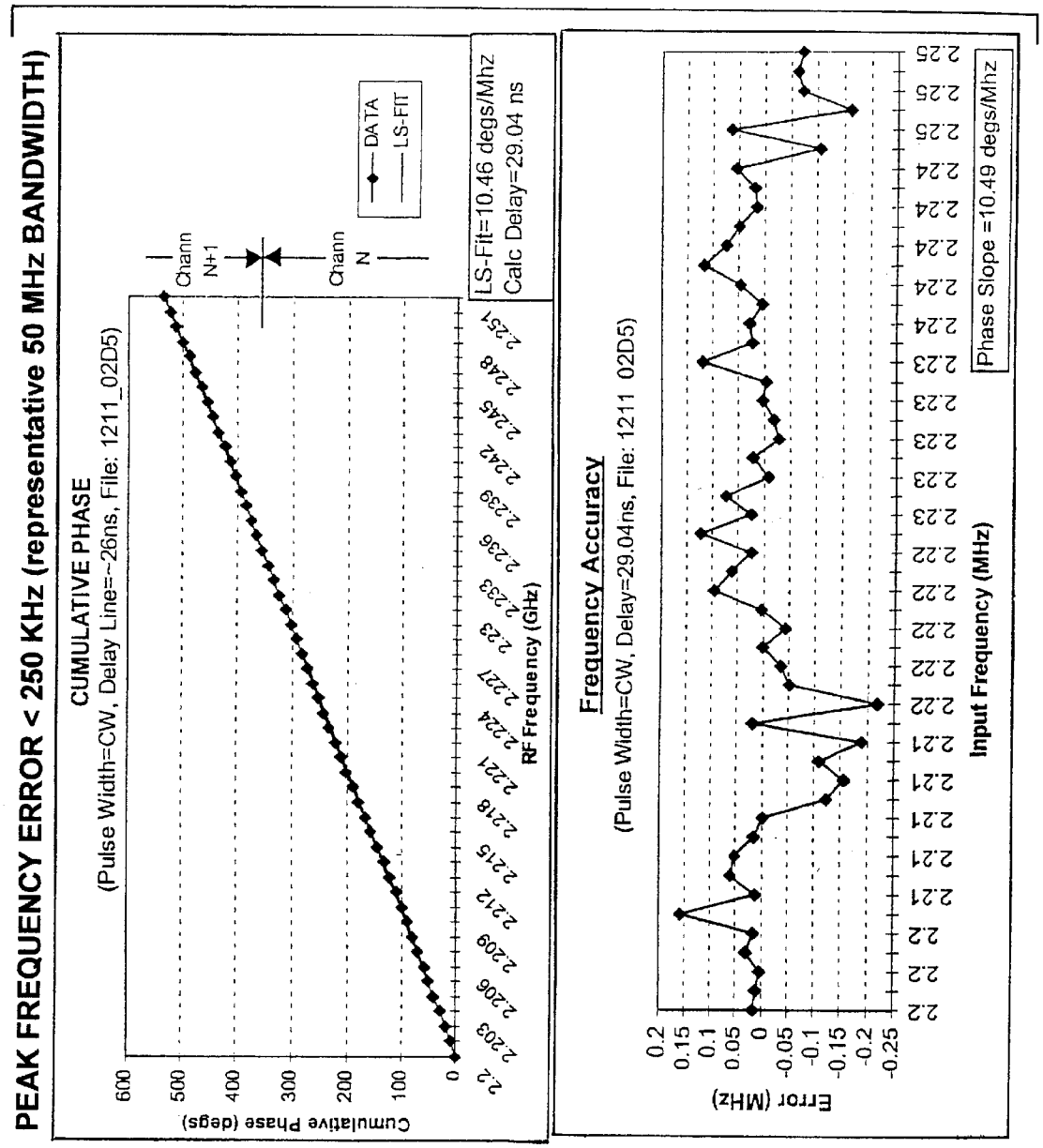
FIG. 6 is a graph of frequency measurement performance of the apparatus of FIG. 1.

The present invention has been experimentally demonstrated for the preferred embodiment. FIG. 6 is a graph of cumulative phase and frequency accuracy measurements. Deviation from a linear fit is representative of calibrated frequency error. Using a 29.04 nanosecond delay line, measured frequency error was less than 0.25 MHz over a 34 MHz unambiguous range. Frequency measurement linearity with input frequency was verified over a 50 MHz range (one coarse channel) in 1 MHz steps. These results indicate the present invention is useful in numerous practical applications.

The present invention provides many advantages over the prior art. IFM technology lacks multiple signal handling capabilities, while RF channelizers provide relatively coarse frequency measurements. Unlike commercial electronic frequency discriminator and IFM devices, the present invention permits frequency measurement of multiple, time-coincident, and CW signals. Compared to multi-channel techniques such as RF filter banks and channelized receivers, the present invention provides increased frequency measurement resolution using intrachannel phase-based techniques, and sustainable accuracy across the entire operating bandwidth and temperature range through continuous phase offset correction.

Additionally, current frequency discriminator and IFM devices must function (internally) over a limited amplitude dynamic range to achieve acceptable measurement accuracy. In contrast, the present invention functions correctly over a much wider dynamic range, limited primarily by noise and photodetector saturation. This extends the achievable system-level dynamic range and simplifies the system design by eliminating RF limiting circuitry requirements. The resulting compact size, low power consumption, and reduced complexity increases system mean time before failure (MTBF) to reduce operational cost.

In the preferred embodiment, several optimizations may be identified as characteristic of the present invention in general. First, a single apparatus performs signal detection and coarse/fine frequency measurement, avoiding additional delay lines and associated cueing circuitry typically required to coordinate separate coarse and fine frequency measurement assets. Also, a preferred delay time value may be chosen to provide enhanced frequency accuracy, yet avoid phase ambiguities throughout a wide instantaneous bandwidth, which is a feature exploited from channelized optical phase measurement. In addition, a continuous calibration scheme provides phase offset correction over bandwidth and temperature to significantly reduce component phase matching requirements of the RF and optical system elements. Further, low system complexity, as previously described, is expected to result in reduced size, weight, power consumption, and cost over alternative approaches.

Incoherent or coherent detection is possible using the present invention. Incoherent (power) detection, depicted in the preferred embodiment, simplifies subsequent signal processing hardware requirements by performing parameter measurements at a relatively narrow video bandwidth. In contrast, typical coherent signal detection requires more complex processing hardware for operation at intermediate frequencies, but potentially has a larger dynamic range.

Alternative embodiments of the present invention address varying application requirements, such as increased fine frequency resolution, increased bandwidth, or alternate photodetector array 212 readout/frequency encoder 400 configurations, among others.

To achieve increased system bandwidth, multiple instances of the present invention may be configured in end-to-end fashion, each frequency offset from its neighbor to obtain a composite bandwidth equivalent to the sum of individual bandwidths of the present invention.

Improved fine frequency resolution can be achieved using multiple parallel-configured instances of the present invention, each operating over an identical instantaneous bandwidth, but differing in delay line 104 time. In this configuration, individual MSOFM 100 units have carefully chosen delay times that may independently provide ambiguous frequency measurements. Subsequent composite processing of the multiple independent frequency measurements then resolves the ambiguities, using techniques borrowed from the field of RF interferometry. Maximum achievable frequency measurement resolution using this technique typically corresponds to an (ambiguous) frequency measurement resolution of the MSOFM 100 instance having the longest time delay.

Also, the number of coarse frequency channels and overall instantaneous bandwidth is arbitrary. In the preferred embodiment, coarse frequency channels are assumed to be equally spaced and sequentially ordered, but this is not a requirement.

The many features and advantages of the invention are apparent from the detailed specification and, thus, it is intended by the appended claims to cover all such features and advantages of the invention which fall within the true spirit and scope of the invention. Further, since numerous modifications and changes will readily occur to those skilled in the art, it is not desired to limit the invention to the exact construction and operation illustrated and described, and accordingly all suitable modifications and equivalents may be resorted to, falling within the scope of the invention.

What is claimed is:

1. A signal processing apparatus, comprising:
   a signal processor configured to receive a delayed input signal and a non-delayed input signal, the delayed input signal being generated from a composite input signal having a plurality of time-coincident signals of different frequencies and the delayed signal being a time-delayed reproduction of the composite input signal, said signal processor further configured to separate the delayed and non-delayed input signals into multiple, time-concurrent coarse frequency channels, and to determine a phase and a coarse frequency measurement for each coarse frequency channel simultaneously in one measurement cycle; and
   a frequency encoder for converting the phase measurement from each coarse frequency channel to a fine frequency measurement in the same measurement cycle, and for combining the measured coarse frequency and fine frequency into an increased resolution frequency measurement readout.

2. The signal processing apparatus of claim 1, wherein the composite input signal comprises one or more time-coincident RF signals, each being individually resolvable in frequency during a selected acquisition time window, and having carrier modulations selected from the group consisting of amplitude, frequency, phase, on-off keyed, and unmodulated continuous wave.

3. The signal processing apparatus of claim 1, further comprising:
   a power splitter for splitting the composite input signal into two separate signals; and
   a delay line for introducing a time delay to one of the two separate signals.

4. The signal processing apparatus of claim 1, further comprising a downconverter for translating the bandwidth of the composite input signal to an IF band, and wherein said frequency encoder is further configured to calculate a frequency for readout by using a band number from said downconverter to sum a frequency offset to the IF frequency.

5. The signal processing apparatus of claim 1, wherein the delay time is sufficient to unambiguously provide a specified fine frequency resolution within one coarse frequency resolution width.

6. The signal processing apparatus of claim 1, wherein said frequency encoder converts the phase measurement to a fine frequency measurement based on delay time according to the equation $$\Delta F \cong \frac{\Delta \theta}{T \cdot 360}$$

where,
$\Delta \theta$=measured phase difference (degrees),
T=time delay (secs),
360=conversion constant (degrees/Hertz).

7. The signal processing apparatus of claim 1, wherein said signal processor is a frequency channelized phase measurement device, comprising:
   means for separating a bandwidth of the composite input signal into a plurality of frequency channels for the non-delayed input signal and a plurality of corresponding frequency channels for the delayed input signal; and means for combining corresponding frequency channels for the delayed and non-delayed input signals and extracting a relative phase difference for each frequency channel.

8. The signal processing apparatus of claim 7, further comprising means for determining a signal amplitude for each frequency channel of the delayed and non-delayed input signals.

9. The signal processing apparatus of claim 7, further comprising means for determining signal presence in each frequency channel.

10. The signal processing apparatus of claim 7, where in the frequency channelized phase measurement device is a channelized optical phase measurement device, comprising:

a laser configured to generate an optical beam;

a beam splitter for splitting the optical beam into two optical carrier beams;

two channelizer circuits, each channelizer circuit configured to receive one of the optical carrier beams and to receive the delayed and non-delayed input signals, respectively, the optical carrier beams being modulated by the delayed and non-delayed input signals and configured to generate, upon exiting the channelizer circuits, a spatial interference pattern along a phase axis, and to simultaneously generate an angular deflection interference pattern corresponding to frequency spectral components of the delayed and non-delayed input signals along an orthogonal coarse frequency axis;

a Fourier transform lens Fourier for transforming the deflected interference patterns;

a photodetector array, configured such that the Fourier transformed interference patterns are imaged onto said photodetector array and for providing a spectral decomposition of the delayed and non-delayed input signals spatially displaced along the coarse frequency axis, each spectral component contributing to the spatial interference pattern along the phase axis; and a processor for decoding the spatial interference pattern by receiving outputs from said photodetector array and extracting a phase and a coarse frequency measurement for each frequency channel.

11. The signal processing apparatus of claim 10, wherein said processor for decoding the spatial interference pattern further extracts an amplitude measurement for each frequency channel.

12. The signal processing apparatus of claim 7, wherein said frequency encoder comprises:

a phase to fine frequency unit for converting the phase measurement to a fine frequency measurement; and a frequency formatter for combining the coarse and fine frequency measurements for readout.

13. The signal processing apparatus of claim 12, wherein said frequency encoder further comprises:

a phase offset correction unit for correcting phase data offsets prior to conversion by said phase to fine frequency unit.

14. The signal processing apparatus of claim 13, further comprising means for determining a signal amplitude for each frequency channel of the delayed and non-delayed input signals.

15. The signal processing apparatus of claim 13, wherein said frequency encoder further comprises:

an amplitude offset correction unit for correcting amplitude data offsets; and a detection logic unit for detecting active channels within said photodetector array.

16. The signal processing apparatus of claim 15, wherein said frequency encoder further comprises:

a frequency channel centroid logic unit for determining a primary active channel among consecutive detected active channels for a spectral component of each input signal that is resolvable in frequency.

17. The signal processing apparatus of claim 16, wherein said phase to fine frequency unit determines the fine frequency according to the equation $$\Delta F \cong \frac{\Delta \theta}{T \cdot 360}$$

where, $\Delta\theta$=measured phase difference (degrees),

T=time delay (secs),

360=conversion constant (degrees/Hertz).

18. The signal processing apparatus of claim 12, wherein said phase to fine frequency unit determines the fine frequency according to the equation $$\Delta F \cong \frac{\Delta \theta}{T \cdot 360}$$

where, $\Delta\theta$=measured phase difference (degrees),

T=time delay (secs),

360=conversion constant (degrees/Hertz).

19. A signal processing method, comprising:

receiving a composite input signal comprising a plurality of time-coincident signals;

dividing the composite input signal into a non-delayed input signal and a delayed input signal relative to the non-delayed input signal;

determining a coarse frequency and a fine frequency using the delayed and non-delayed input signals; and combining the coarse and fine frequencies to provide a single frequency measurement.

20. The signal processing method of claim 19, wherein the composite input signal comprises one or more time-coincident RF signals, each being individually resolvable in frequency during a selected acquisition time window, and having carrier modulations selected from the group consisting of amplitude, frequency, phase, on-off keyed, and unmodulated continuous wave.

21. The signal processing method of claim 19, further comprising downconverting the bandwidth of the composite input signal to an IF band, and calculating a frequency for readout using a band number from said downconverting to sum a frequency offset to the IF frequency.

22. The signal processing method of claim 19, further comprising providing a delay time for the delayed input signal sufficient to unambiguously provide a specified fine frequency resolution within one coarse frequency resolution width.

23. The signal processing method of claim 19, wherein said determining a coarse frequency and a fine frequency comprises:

separating a bandwidth of the composite input signal into a plurality of frequency channels for the non-delayed input signal and a plurality of corresponding frequency channels for the delayed input signal; and combining corresponding frequency channels for the delayed and non-delayed input signals and extracting a relative phase difference measurement for each frequency channel.

24. The signal processing method of claim 23, further comprising determining a signal amplitude for each frequency channel.

25. The signal processing method of claim 23, further comprising determining signal presence in each frequency channel of the delayed and non-delayed input signals.

26. The signal processing method of claim 23, further comprising:
generating an optical beam;
splitting the optical beam into two optical carrier beams;
receiving each optical carrier beam by a separate channelizer circuit, modulating each optical carrier beam by the delayed and non-delayed input signals, and generating, when the modulated optical carrier beams exit the channelizer circuits, a spatial interference pattern along a phase axis, and simultaneously generating an angular deflection interference pattern corresponding to frequency spectral components of the delayed and non-delayed input signals along an orthogonal coarse frequency axis;
Fourier transforming the deflected interference patterns;
imaging the Fourier transformed interference patterns onto a photodetector array and providing a spectral decomposition of the delayed and non-delayed input signals spatially displaced along the coarse frequency axis, each spectral component contributing to the spatial interference pattern along the phase axis; and
decoding the spatial interference pattern by receiving outputs from the photodetector array and extracting a phase and a coarse frequency measurement for each frequency channel.

27. The signal processing method of claim 26, further comprising extracting an amplitude measurement for each frequency channel.

28. The signal processing method of claim 23, further comprising:
converting the phase difference measurement to a fine frequency measurement; and
combining the coarse and fine frequency measurements for readout.

29. The signal processing method of claim 28, further comprising:
correcting phase data offsets prior to said converting the phase difference measurement to a fine frequency measurement.

30. The signal processing method of claim 29, further comprising determining a signal amplitude for each frequency channel.

31. The signal processing method of claim 30, further comprising:
correcting amplitude data offsets; and
detecting active channels within the photodetector array.

32. The signal processing method of claim 31, further comprising:
determining a primary active channel among consecutive detected active channels for extracting a spectral component of each input signal that is resolvable in frequency.

33. The signal processing method of claim 32, wherein said converting the phase difference measurement to a fine frequency measurement determines the fine frequency according to the equation $$\Delta F \cong \frac{\Delta \theta}{T \cdot 360}$$

where,
$\Delta \theta$=measured phase difference (degrees),
T=time delay (secs),
360=conversion constant (degrees/Hertz).

34. The signal processing method of claim 28, wherein said converting the phase difference measurement to a fine frequency measurement determines the fine frequency according to the equation $$\Delta F \cong \frac{\Delta \theta}{T \cdot 360}$$

where,
$\Delta \theta$=measured phase difference (degrees),
T=time delay (secs),
360=conversion constant (degrees/Hertz).

35. A signal processing apparatus for providing concurrent electrical frequency measurements of multiple, time-coincident signal inputs, comprising:
a multiple input signal containing a plurality of individual signals independent of each other in frequency, phase, and electrical amplitude;
a power splitter for splitting said multiple input signal into two separate input signals;
one or more delay lines for introducing a time delay to one of the input signals;
a channelized optical phase measurement device comprising:
two channelizer circuits, each channelizer circuit configured to receive an optical carrier beam and to receive the is delayed and non-delayed input signals, respectively, the optical carrier beams being modulated by the delayed and non-delayed input signals and further configured to generate, upon exiting the channelizer circuits, a spatial interference pattern along a phase axis, and to simultaneously generate an angular deflection interference pattern corresponding to frequency spectral components of the delayed and non-delayed input signals along an orthogonal coarse frequency axis,
a photodetector array, configured such that the deflected interference patterns are Fourier transformed and imaged onto said photodetector array and for providing a spectral decomposition of the delayed and non-delayed input signals spatially displaced along the coarse frequency axis, each spectral component contributing to the spatial interference pattern along the phase axis, and
a processor for decoding the spatial interference pattern by receiving outputs from said photodetector array and extracting a phase, an amplitude, and a coarse frequency measurement for each frequency channel; and
a frequency encoder comprising:
a phase to fine frequency unit for converting the phase measurement to a fine frequency measurement, and
a frequency formatter for combining the coarse and fine frequency measurements for readout.

36. The signal processing apparatus of claim 35, wherein said phase to fine frequency unit determines the fine frequency according to the equation $$\Delta F \cong \frac{\Delta \theta}{T \cdot 360}$$

where, $\Delta \theta$ = measured phase difference (degrees),

T = time delay (secs),

360 ≡ conversion constant (degrees/Hertz).

37. A signal processing method for providing concurrent electrical frequency measurements of multiple, time-coincident signal inputs, comprising:

receiving a multiple input signal containing a plurality of individual signals independent of each other in frequency, phase, and electrical amplitude;

splitting the multiple input signal into two separate input signals;

introducing a time delay to one of the input signals;

receiving two optical carrier beams by two separate channelizer circuit, respectively, modulating each optical carrier beam by the delayed and non-delayed input signals, and generating, when the modulated optical carrier beams exit the channelizer circuits, a spatial interference pattern along a phase axis, and simultaneously generating an angular deflection interference pattern corresponding to frequency spectral components of the delayed and non-delayed input signals along an orthogonal coarse frequency axis;

Fourier transforming the deflected interference patterns and imaging the Fourier transformed interference patterns onto a photodetector array and providing a spectral decomposition of the delayed and non-delayed input signals spatially displaced along the coarse frequency axis, each spectral component contributing to the spatial interference pattern along the phase axis;

decoding the spatial interference pattern by receiving outputs from the photodetector array and extracting a phase, an amplitude, and a coarse frequency measurement for each frequency channel; and generating a single frequency for readout by converting the phase measurement to a fine frequency measurement and combining the coarse and fine frequency measurements for readout.

38. The signal processing method of claim 37, wherein converting the phase measurement to a fine frequency measurement determines the fine frequency according to the equation $$\Delta F \cong \frac{\Delta \theta}{T \cdot 360}$$

where, $\Delta \theta$ = measured phase difference (degrees),

T = time delay (secs),

360 ≡ conversion constant (degrees/Hertz).

* * * * *